United States Patent
Harada

(10) Patent No.: US 7,550,916 B2
(45) Date of Patent: Jun. 23, 2009

(54) PROCESS OF PRODUCING LIGHT EMITTING PANEL, PROCESS OF PRODUCING DISPLAY PANEL AND DISPLAY PANEL

(75) Inventor: Gaku Harada, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 384 days.

(21) Appl. No.: 11/393,650

(22) Filed: Mar. 31, 2006

(65) Prior Publication Data

US 2006/0220550 A1 Oct. 5, 2006

(30) Foreign Application Priority Data

Mar. 31, 2005 (JP) ............................. 2005-101673

(51) Int. Cl.
*H01J 1/62* (2006.01)
*H01J 63/04* (2006.01)
(52) U.S. Cl. ....................................... 313/504; 313/512
(58) Field of Classification Search ................. 313/504, 313/506, 512
See application file for complete search history.

(56) References Cited

U.S. PATENT DOCUMENTS 5,962,962 A * 10/1999 Fujita et al. ................. 313/412
6,208,075 B1 * 3/2001 Hung et al. .................. 313/504

FOREIGN PATENT DOCUMENTS

JP 2001-126866 5/2001

* cited by examiner

*Primary Examiner*—Joseph L Williams
(74) *Attorney, Agent, or Firm*—McDermott Will & Emery LLP

(57) ABSTRACT

The invention relates to a process of producing a display panel, the process comprising a step of providing plural display regions on the principal plane of a support substrate, a step of applying an adhesive to the principal plane of the support substrate so as to cover the display region, to form a seal layer and laminating a seal plate through the seal layer to form a laminate and a step of dividing the laminate at the positions between the display adjacent to each other to produce plural light emitting panels each having the display region, the process further comprising a step of forming an adhesion preventive layer that inhibits adhesion to the adhesive on the principal plane of the support substrate between the display regions adjacent to each other prior to the application of the adhesive.

3 Claims, 4 Drawing Sheets

FIG. 4
(a)
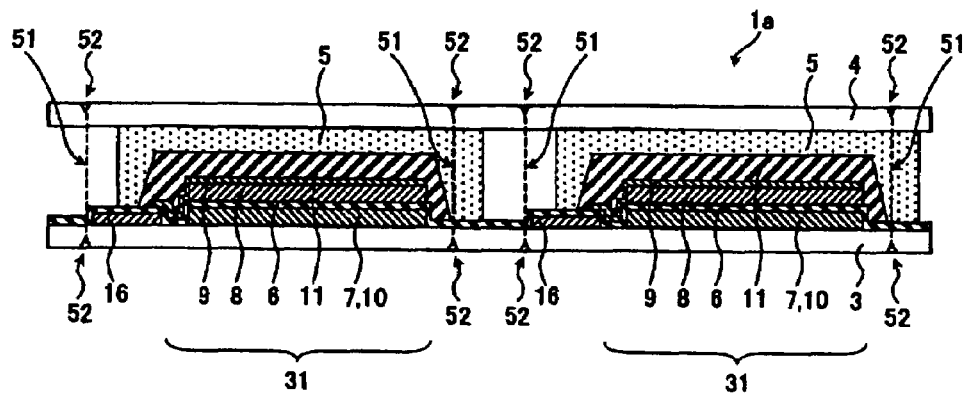
(b)
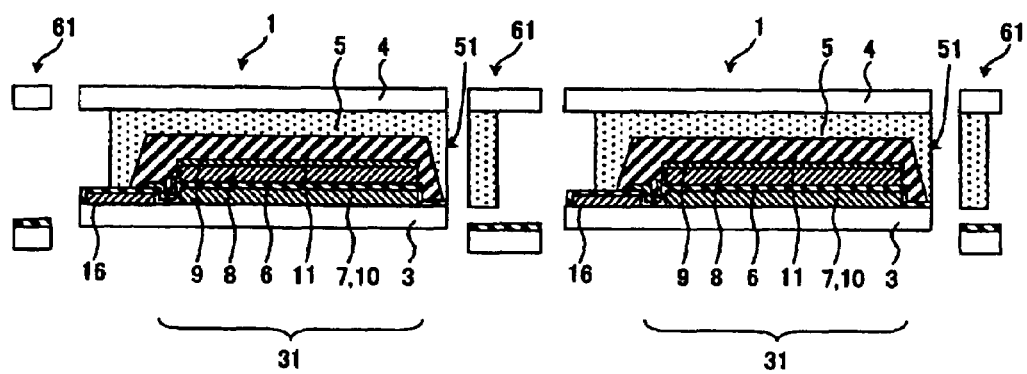
(c)
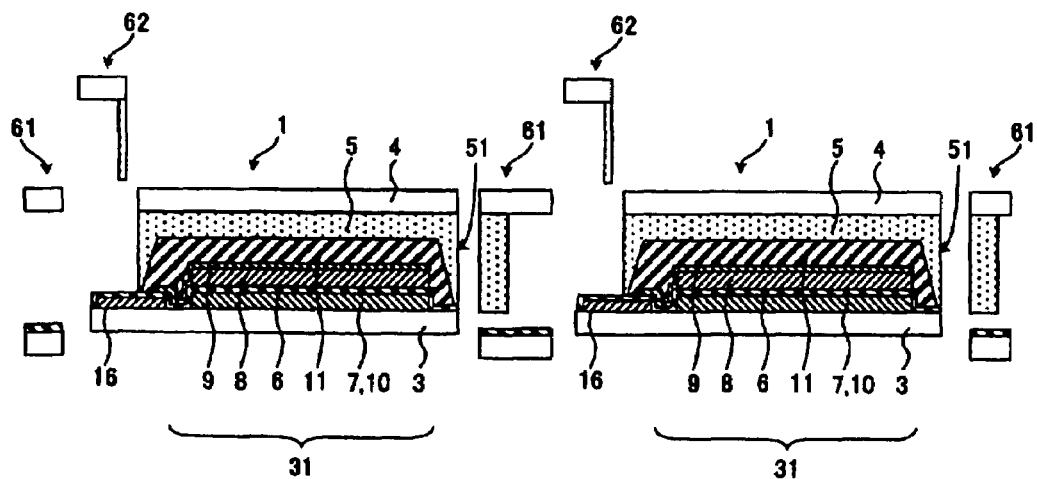

PROCESS OF PRODUCING LIGHT
EMITTING PANEL, PROCESS OF
PRODUCING DISPLAY PANEL AND DISPLAY
PANEL

BACKGROUND OF THE INVENTION

1. Field of the Invention

The invention relates to a process of producing plural light emitting panels by sealing plural luminous regions between a support substrate and a seal plate which constitute a unit and by dividing the resulting product.

Also, the invention relates to a process of producing plural display panels by sealing plural display regions between a support substrate and a seal plate which constitute a unit and by dividing the resulting product.

Also, the present invention relates to a display panel.

2. Description of the Related Art

A remarkable attention has been focused on electroluminescence (hereinafter abbreviated as an organic EL) elements as self-emitting type luminous elements in recent years and organic EL displays using these organic EL elements are being developed. Organic EL elements have the characteristics, such as high response speed and operations carried out under low voltage by low power consumption, which are preferable for displaying moving images and therefore, these organic displays are expected to become displays in the next generation including portable telephones and personal digital assistants (PDA) of the next age.

These organic EL displays are provided with an organic EL display panel having a display region containing plural organic EL elements for image display, a driving circuit and a driving power source.

The organic EL element is deteriorated in luminous characteristics when it is in contact with moisture and it is therefore necessary to make an organic EL display panel by sealing the organic element such that the organic EL element is not brought into contact with moisture. The organic EL display panel is produced by applying a seal plate, through an adhesive, to a support substrate on which organic EL elements are formed.

In a process of producing the organic EL display panel, a production method called multiple image production is frequently adopted. The multiple image production is a method in which a specified number of display regions composed of an organic EL element are formed simultaneously on one large support substrate having a size specified times that of one organic EL display panel, one large seal plate having the same size as the support substrate is applied to the display region side of the support substrate by using an adhesive and a laminate of both plates applied to each other is divided into plane pieces each including one display region. This method makes it possible to produce a specified number of organic EL display panels each having the above display region simultaneously.

As one of methods of producing an organic EL display panel in the above production method, there is a method in which a support substrate and a seal plate are sealed through a photocurable resin, the photocurable resin except for dividing parts is selectively cured and the substrate is divided at parts where an uncured photocurable resin is left into pieces containing each EL display panel (see the publication of Japanese Patent Application Laid-Open No. 2001-126866).

However, in order to selectively cure the part covering the above display region among the photocurable resin as mentioned above in the method of producing an organic EL display panel which method is described in the publication of Japanese Patent Application Laid-Open No. 2001-126866, it is necessary to use an exposure mask in which a light-shading part is formed so as to prevent the dividing parts from being irradiated with light and to irradiate the photocurable resin with light through the transmitting part of the exposure mask after this exposure mask is subjected to alignment. Therefore, there is such an disadvantage that the steps of producing the organic EL display panel are increased.

Moreover, there is the disadvantage that an uncured photocurable resin adheres to the organic EL display panel when the above display regions are divided. There is the possibility that such an uncured photocurable resin adheres to various places in the subsequent working steps and therefore, the uncured photocurable resin is removed by washing. As a washing method, there is a method in which the uncured photocurable resin is wiped using an organic solvent such as alcohol and a method in which the organic EL display panel is dipped in an organic solvent. However, in this case, the organic solvent and the like penetrate into the organic EL display panel during washing and there is therefore a fear that the luminous characteristics and reliability of the organic EL element are lowered by, for example, a deterioration in the organic material present in the above display region. Also, such a washing operation must be carried out every individual organic EL display panel after the above display regions are divided, and therefore, the yield of production is dropped because the steps of producing the organic EL display panel are increased.

As mentioned above, according to the method of producing an organic EL display panel described in the publication of Japanese Patent Application Laid-Open No. 2001-126866, the drop in the yield of production causes high production costs.

SUMMARY OF THE INVENTION

It is an object of the present invention to provide a process of producing an organic EL display panel, the method being able to secure the luminous characteristics and reliability of an organic EL element while limiting a reduction in production yield. Another object of the present invention is to provide an organic EL display panel having good luminous characteristics and high reliability.

According to a first aspect of the present invention, there is provided a process of producing a light emitting panel, the process comprising a step of providing plural luminous regions on the principal plane of a support substrate, a step of applying an adhesive to the principal plane of the support substrate so as to cover the luminous region, to form a seal layer and laminating a seal plate through the seal layer to form a laminate and a step of dividing the laminate at the positions between the luminous regions adjacent to each other to produce plural light emitting panels each having the luminous region, the process further comprising a step of forming an adhesion preventive layer that inhibits adhesion to the adhesive on the principal plane of the support substrate between the luminous regions adjacent to each other prior to the application of the adhesive.

The light emitting panel of the present is one having a luminous region provided with a self-emitting element. As the self-emitting element, not only an organic EL element, but also, an inorganic EL element, FED element, ECL element or the like may be used. Therefore, the light emitting panel may be applied to display devices that control the luminescence of a self-emitting element every pixel. The panel may also be applied to a plane uniform light emitting panel such as a backlight for liquid crystal displays or a panel-type illumination device.

According to the production process of the present invention, the adhesive can be prevented from adhering to the principal plane of the support substrate at the position where the laminate is divided and it is therefore possible to divide the laminate with ease. Also, no uncured adhesive is left and it is therefore unnecessary to wash the laminate after the laminate is divided.

According to a second aspect of the present invention, there is provided a process of producing a display panel, the process comprising a step of providing plural display regions on the principal plane of a support substrate, a step of applying an adhesive to the principal plane of the support substrate so as to cover the display region, to form a seal layer and laminating a seal plate through the seal layer to form a laminate and a step of dividing the laminate at the positions between the display regions adjacent to each other to produce plural display panels each having the display region, the process further comprising a step of forming an adhesion preventive layer that inhibits adhesion to the adhesive on the principal plane of the support substrate between the display regions adjacent to each other prior to the application of the adhesive.

The display panel of this invention is one having a display region provided with a display element. As such a display element, light-emitting type display elements such as an organic EL element, inorganic EL element, FED element, ECL element or the like may be used and also, non-light-emitting type display elements such as a polymer LCD may be used.

According to the production process of this invention, the adhesive can be prevented from adhering to the principal plane of the support substrate at the position where the laminate is divided and it is therefore possible to divide the laminate with ease. Also, no uncured adhesive is left in place which need no adhesion and it is therefore unnecessary to wash the laminate after the laminate is divided.

In a preferred embodiment of this invention, the process further comprising a limiting layer forming step of limiting the plane position of the surface from which the adhesion preventive layer is exposed, by partially covering the adhesion preventive layer between the adhesion preventive layer forming step and the seal layer forming step.

According to this embodiment, the region where the adhesive adheres to the principal plane can be selected posteriorly.

In this invention, the limiting layer forming step in the process of producing a display panel wherein the display region is made of an organic EL element preferably doubles as the step of forming a layer constituting the organic EL element.

The use of such a production process enables the formation of the layer constituting the organic EL element and the formation of the region that can adhere to the adhesive at the same time, and it is therefore possible to set the plane position of the surface from which the adhesion preventive layer is exposed, self-conformably. Moreover, a new patterning step such as photolithography for forming the region that can adhere to the adhesive becomes unnecessary and therefore an increase in production steps can be limited.

As the layer constituting the organic EL element, any one of an anode, an organic layer and a cathode or a combination of them may be used insofar as it is a layer which partially covers the adhesion preventive layer to limit the plane position of the surface from which the adhesion preventive layer is exposed.

In the process of producing a display panel in which the display region is made of an organic EL element in this invention, the aforementioned limiting layer is preferably formed so as to cover the display region, whereby the display region doubles as the protective layer in the display region.

The use of such a production process enables the formation of the protective layer and the formation of the region that can adhere to the adhesive at the same time. A new patterning step such as photolithography for forming the region that can adhere to the adhesive becomes unnecessary and therefore an increase in production steps can be limited. Also, since the protective layer having low moisture permeability is eventually disposed on the organic EL element, this structure can prevent moisture from penetrating into the organic material constituting the organic EL element and from deteriorating the organic material and therefore, a highly reliable display panel can be provided.

In this invention, the adhesion preventive layer forming step preferably doubles as a charge injection layer or a charge transport layer that constitutes the organic EL element and is made of an organic fluorine compound.

The use of such a production method ensures that the adhesion preventive layer forming step and the step of forming the layer constituting the organic EL element can be performed simultaneously, making it possible to simplify the production step. Also, the use of the organic fluorine compound as the charge injection layer or charge transport layer of the organic EL element makes it possible to produce a display panel which has excellent luminous characteristics and in which the display region is constituted of the organic EL element.

In a more preferred embodiment of this invention, the adhesion preventive layer is formed on the entire surface of the principal plane of the support substrate in the adhesion preventive layer forming step.

When such a production method is used, the adhesion preventive layer forming step and the step of forming the layer constituting the organic EL element can be carried out simultaneously without patterning and therefore, the production step can be more simplified.

In this invention, the process preferably further comprises a step of subjecting the surface of the limiting layer to a silane coupling treatment after the step of forming the limiting layer.

When such a production process is used, the adhesion between the surface of the limiting layer and the adhesive can be strengthened, and therefore, the penetration of moisture into the organic EL element can be more suppressed. It is therefore possible to provide a display panel that is improved in reliability and provided with the display region constituted of the organic EL element.

In this invention, hydroxyl groups are preferably present in the surface of the limiting layer.

The use of such a production method ensures that the adhesion between the surface of the limiting layer and the adhesive can be strengthened and therefore, the penetration of moisture into the organic EL element can be more suppressed. It is therefore possible to provide a display panel that is improved in reliability and provided with the display region constituted of the organic EL element.

In this invention, the adhesion preventive layer forming step preferably involves a step of making hydrophobic the surface of the support substrate and the limiting layer forming step preferably involves a step of making non-hydrophobic the surface of the support substrate.

When such a production method is used, the adhesion preventive layer forming step and the limiting layer forming step can be carried out with ease.

Here, the non-hydrophobic treatment involves reducing hydrophobic groups exposed from the surface significantly by covering a hydrophobic layer or a hydrophobic group existing in the surface of a material.

According to a third aspect of the present invention, there is provided a display panel comprising a support substrate, an organic EL element formed on the support substrate, a seal layer that is disposed on the organic EL element and constituted of an adhesive, a seal plate that is stuck to the organic EL element by the seal layer and a terminal section disposed on the support substrate to drive the organic EL element, wherein an organic fluoride layer is disposed in the organic EL element and above the terminal section.

The structure of the display panel of this invention can prevent the accidents which are based on electric connection inferiors between the terminal section and wiring and are probably caused when the adhesive is left unremoved above the terminal because the adhesive of the seal layer is not stuck to the terminal section.

According to the structure of the display panel of the present invention, the organic fluorine compound disposed above the terminal section has a hydrophobic effect and no moisture penetrates into the terminal section. It is therefore possible to suppress the occurrence of corrosion of the terminal section caused by moisture.

In the display panel of the present invention, the organic fluoride compound layer of the organic EL element is made to function as a charge injection layer or a charge transport layer f or promoting the injection of electrons into the luminous layer and the transport of electrons to the luminous layer. Also, the organic fluoride compound layer covering the terminal section can be made to function as the adhesion preventive layer that prevents the seal layer above the organic EL element from adhering to the terminal section.

Therefore, according the structure of the display panel of the present invention, the organic fluoride compound layer is made to double as the adhesion preventive layer that covers the terminal section to prevent the adhesive on the organic EL element of the display panel from adhering to the terminal and as the material of the charge transport layer or charge injection layer used as the organic EL element. Therefore, it is unnecessary to use a special material as the adhesive element layer covering the terminal section, making it possible to reduce the number of materials.

According to this invention, a process of producing a light emitting panel and a display panel can be provided wherein the production step for polyhedral chamfer is simplified to improve production yield. Also, this invention can provide a process of producing a display panel wherein the luminous characteristics and reliability of an organic EL element are secured in spite of simplifying the production step for polyhedral chamfer.

Also, according to this invention, it is possible to attain a display panel in which the luminous characteristics and reliability of the organic EL element can be secured. According to present invention, a display panel suitable to the production step for polyhedral chamfer can be provided.

BRIEF DESCRIPTION OF THE DRAWINGS

FIGS. 4A to 4C are typical sectional views showing a process of producing an organic EL display panel according to the present invention.

DETAILED DESCRIPTION OF THE INVENTION

An embodiment of the present invention will be hereinafter explained with reference to the drawings.

EMBODIMENT 1

First, the structure of an organic EL display panel manufactured using a production process according to this embodiment will be explained with reference to FIGS. 1 to 4C.

1-1. Whole Structure of the Organic EL Display Panel

Figure 1:
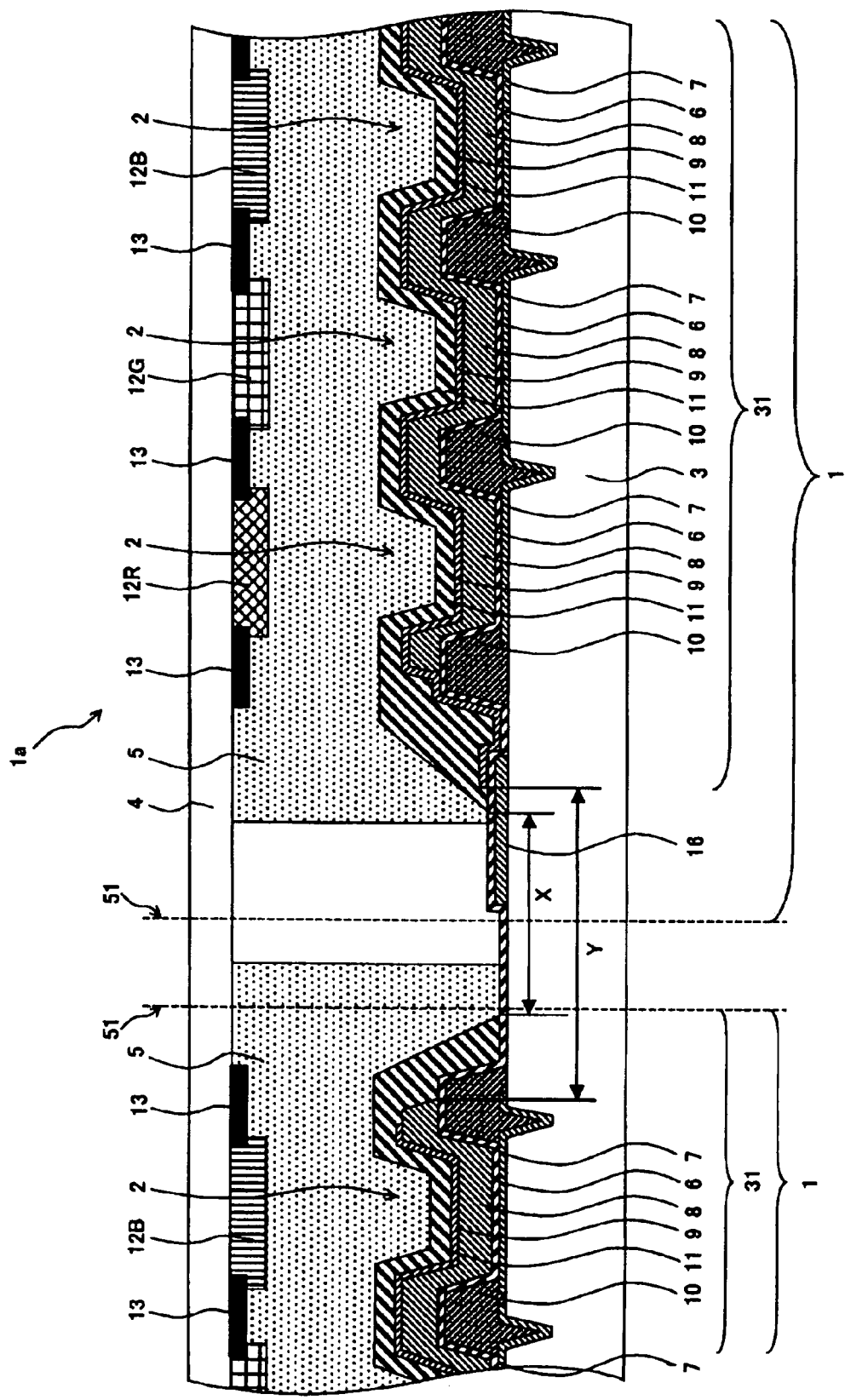
FIG. 1 is a typical sectional view showing the structure of an organic EL display panel according to the present invention.
Figure 2:
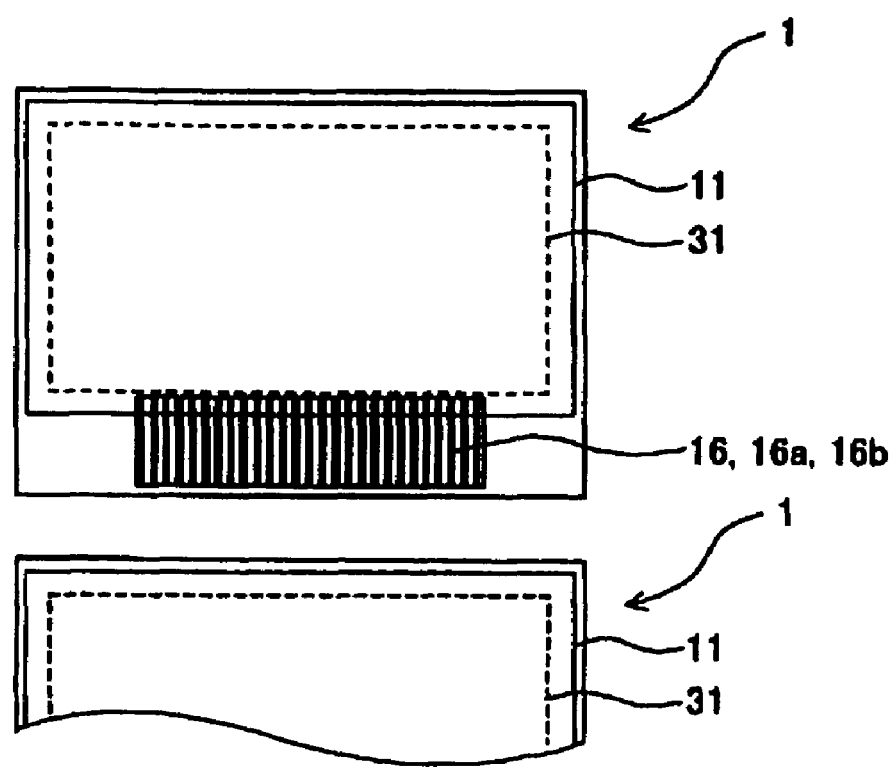
FIG. 2 is a typical plan view showing the structure of an organic EL display panel according to the present invention.
Figure 3:
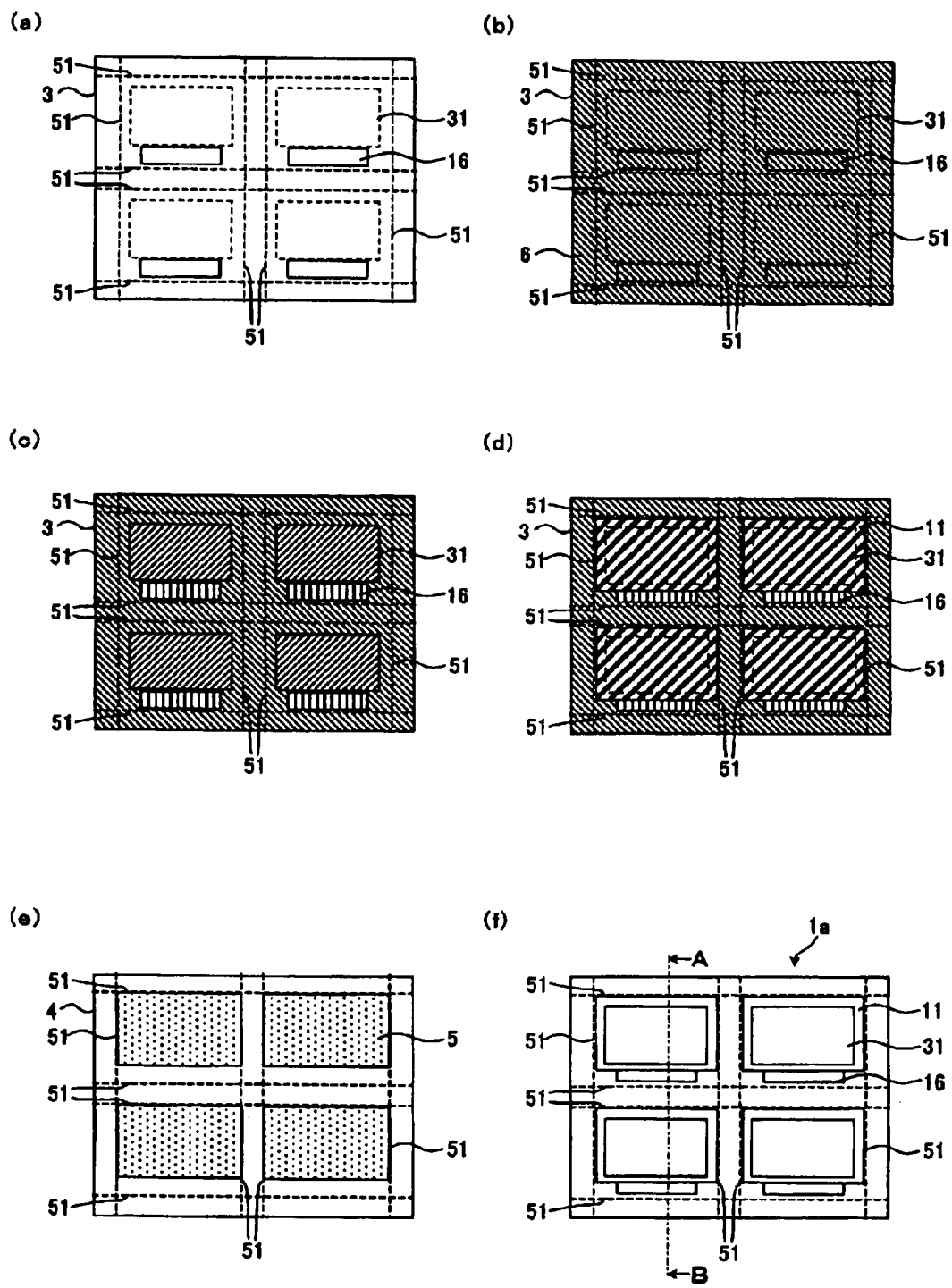
FIGS. 3A to 3F are typical plan views showing a process of producing an organic EL display panel according to the present invention.

FIGS. 1 and 2 are a typical sectional view and a plan view for explaining the structure of the organic EL display panel produced using a production process according to this embodiment.

FIG. 1 shows the state of a laminate 1a before neighboring organic EL display panels 1 are divided into two organic EL display panels and is a view illustrating two organic EL display panels adjacent to each other through a dividing part 51. After the laminate 1a is produced, the neighboring organic EL display panes 1, 1 are divided at the dividing part 51. The organic EL display panel 1 is structured by sealing a display region 31 between a support substrate 3 and a seal plate 4 for sealing through a seal layer 5 for sealing.

The support substrate 3 is structured using a TFT substrate provided with a driving TFT. Also, plural organic EL elements 2, 2 . . . are disposed and the display region 31 is structured of these EL elements 2, 2 . . . .

The organic EL elements 2, 2 . . . are structured by laminating an anode 7, an adhesion preventive layer 6, an organic layer 8 and a cathode 9 in this order from the support substrate 3 side as shown in FIG. 1. The neighboring organic EL elements 2, 2 are isolated by a cell separating film 10 made of an insulation material.

The anode 7 is structured of a metal compound such as ITO (indium-tin oxide). A light reflecting material made of a metal such as Ag (silver) or an alloy may be disposed under the metal compound. Also, the anode 7 like this is formed separately in each organic EL element 2.

The adhesion preventive layer 6 prevents the support substrate 3 from adhering to the seal layer 5. As the adhesion preventive layer 6, a hydrophobic film made of a material having a small critical surface tension ($\gamma c$), for example, fluorine compounds (e.g., CFx, polytetrafluoroethylene and polyfluoroethylene) or polyolefins (polypropylene or polyethylene), which has a critical surface tension of 31 dyne/cm or less may be used.

In this embodiment, the adhesion preventive layer 6 doubles as a layer constituting the organic EL element 2. As the layer constituting the organic EL element 2, layers supplying holes to the luminous layer from the anode, for example, a hole injection layer and a hole transport layer may be used. Also, when the organic EL element 2 has a structure in which a cathode is disposed on the support substrate 3 side and an anode is disposed on the seal plate 4 side, a layer that injects electrons to the luminous layer, for example, an electron injection layer, an electron transport layer or the like may be used.

The adhesion preventive layer 6 doubling as the layer constituting the organic EL element 2 is constituted using an organic fluorine compound, for example, $CF_x$. The film thickness of the adhesion preventive layer 6 doubling as the layer constituting the organic EL element 2 is preferably 10 nm or less.

The organic layer 8 is constituted by laminating, for example, a luminous layer and an electron transport layer in this order from the anode 7 side and the organic EL element 2 has the following structure: anode/hole injection layer/luminous layer/electron transport layer/cathode. However, the organic EL element 2 is not limited to this structure but may take the following well-known structures:

(1) Anode/hole injection layer/luminous layer/cathode;

(2) Anode/hole injection layer/luminous layer/electron injection layer/cathode;

(3) Anode/hole injection layer/hole transport layer/luminous layer/electron injection layer/cathode; and (4) Anode/hole injection layer/hole transport layer/luminous layer/electron transport layer/electron injection layer/cathode.

In this embodiment, the luminous layer is designed to be one which has a two-layer structure prepared by laminating a luminous layer emitting blue light and a luminous layer emitting orange light and can emit white light.

The cathode 9 is constituted of a light-transmitting material comprising a metal compound such as ITO, a metal or an alloy. In this embodiment, as shown in FIG. 1, the cathode 9 is formed continuously so as to cover each organic EL element 2 and is common to these organic EL elements 2, 2 . . . . Also, the cathode 9 is covered with a limiting layer 11 in this embodiment.

The limiting layer 11 is a layer that covers the adhesion preventive layer 6 partially to limit the plane position of the surface from which the adhesion preventive layer is exposed, and is constituted of a material that adheres to the seal layer 5. In this embodiment, the limiting layer 11 doubles as a protective layer that includes the display region 31 and is formed in such a manner as to exclude the dividing part 51. The limiting layer 11 is not limited to the case where it has a function as the protective layer. When the protective layer is not present, the limiting layer 11 may doubles as a layer, such as the anode 7, the organic layer 8 or the cathode 9, which constitutes the organic EL element 2. In this embodiment, as shown in FIG. 1, the limiting layer 11 covers the adhesion preventive layer 6 except for the region shown by X to limit the plane position of the surface from which the adhesion preventive layer 6 is exposed like the case of this embodiment. When the protective layer is not present in FIG. 1, the adhesion preventive layer 6 excluding the region shown by Y is covered with the limiting layer. In this case, the cathode 9 and the organic layer 8 are respectively the limiting layers. As mentioned above, the limiting layer may be, besides the above protective layer, an inorganic layer such as a cathode or an organic layer such as a luminous layer which constitutes the organic EL element 2.

As the limiting layer 11, for example, a non-hydrophobic film may be used. Such a non-hydrophobic film very decreases hydrophobic groups exposed from the surface by covering hydrophobic groups existing in the surface of a material to promote the adhesion of the seal layer 5 to the display region 31.

The limiting layer 11 may have a function as the protective layer which has low moisture permeability so that it limits the penetration of moisture into the organic EL element 2. As the material of the limiting layer 11, an inorganic oxide or inorganic nitride such as silicon oxide, silicon nitride, silicon oxynitride, aluminum oxide, titanium oxide, tantalum oxide or zinc oxide is used. Also, the protective layer may be a single layer or a laminate of these inorganic oxides and inorganic nitrides or may be a laminate structure of an inorganic oxide, an inorganic nitride and an organic material.

Moreover, the limiting layer 11 preferably has a hydroxyl group in the surface of the outermost layer. Therefore, such the limiting layer 11 is preferably formed by a CVD method. This is because the hydroxyl group can be formed in the surface of the outermost layer if the CVD method is used.

The seal plate 4 is constituted of a light transmittable material having a red (R), a green (G) and a blue (B) color filter 12R, 12G and 12B on its surface facing the organic EL element 2. Also, a black matrix 13 is arranged between neighboring color filters.

Then, this embodiment is so structured that plural organic EL elements 2, 2 . . . emit white light and the white light emitted from the organic EL elements 2, 2 . . . are taken out through the R, G and B color filters 12R, 12G and 12B. This embodiment, as mentioned above, has a top-emission structure in which the light emitted from the luminous layer is taken out of the seal plate 4 side.

Also, this embodiment has a structure in which the white light emitted from the luminous layer is taken out through the color filter to thereby obtain lights of three colors, namely, red, green and blue. However, this embodiment may have a structure in which as the luminous layer, coating solutions for three types of layers, namely, a red light emitting layer, a green light emitting layer and a blue light emitting layer which emit a red, a green and a blue light respectively are applied separately, to obtain three different color lights, namely, red light, green light and blue light.

In this figure, the seal layer 5 is made of a ultraviolet curable type, visible light curable type, heatcurable type, complex curable type to be cured by ultraviolet rays and heat or post-curable type resin cured by ultraviolet rays. In the case of using the seal plate 4 having a color filter or CCM (color conversion layer), ultraviolet light cannot transmit the filter part and therefore, a heatcurable type resin, visible light-curable type resin or post-curable type resin to be cured using ultraviolet light is used.

Specifically, as the seal layer 5, radical type photocurable type adhesive using a heatcurable resin type such as a urea resin type, melamine resin type, phenol resin type, resorcinol resin type, epoxy resin type, unsaturated polyester resin type, polyurethane resin type or acryl rein type, and a thermoplastic resin type such as a vinyl acetate resin type, ethylene/vinyl acetate copolymer resin type, acryl resin type, cyanoacrylate resin type, polyvinyl alcohol resin type, polyamide resin type, polyolefin resin type, thermoplastic polyurethane resin type, saturated polyester resin type or cellulose type, various acrylates such as ester acrylate, urethaneacrylate, epoxyacrylate, melamine acrylate or acryl resin acrylate or a resin such as urethane polyester, cationic photocurable type adhesives using an epoxy rein or vinyl ether, thiol/ene addition type resin type adhesives, rubber type adhesives such as a chloroprene rubber type, nitrile rubber type, styrene/butadiene rubber type, natural rubber type, butyl rubber type or complex type synthetic polymer adhesives such as vinyl/phenolic, chloroprene/phenolic, nitrile/phenolic, nylon/phenolic and epoxy/phenolic may be used.

The dividing part 51 is disposed between the display regions 31, 31 adjacent to each other. In this embodiment, as shown in FIG. 1, there is a place where the dividing part 51 is disposed, between a terminal section 16 and the display region 31 adjacent to the terminal section 16. Also, the aforementioned adhesion preventive layer 6 is formed on the surface of the seal plate 4 including the dividing part 51 and on the aforementioned anode 7.

FIG. 2 is a typical plan view of the organic EL display panel 1, showing that the terminal section 16 is disposed close to the display region 31 and the limiting layer 11. The terminal section 16 is constituted of an anode leader part 16a and a cathode leader part 16b that are connected to the anode and cathode of the organic EL element respectively through the above TFT. In FIG. 2, the terminal section 16 is disposed locally around one side among four sides of the display region 31. However, the position of the terminal section 16 is not limited to this and the terminal section 16 may be divided into four parts, which are disposed around four sides of the display region 31.

Although it is so illustrated in FIG. 1 that the cathode 9 is connected to the terminal section 16 for the sake of simplicity, actually the cathode 9 is connected to the cathode leader part 16b (not shown in FIG. 1) in the terminal section 16 and the anode 7 is connected to the cathode leader part 16a (not shown in FIG. 1) in the terminal section 16 in each organic EL element 2.

As shown in FIGS. 1 and 2, the terminal section 16 is disposed close to the display region 31 outside of the region 31. Electric signals are supplied to the display region 31 from the outside through the terminal section 16. It is preferable that the seal layer 5 be not present on the terminal section 16. This reason is as follows: after the neighboring organic EL display panels 1, 1 are divided at the dividing part 51, the seal plate 4 at the position corresponding to the place above the terminal section 16 is separated from the organic EL display panel 1 to expose the terminal section 16, and the above structure makes such separating works easy.

Also, the adhesion preventive layer 6 exists between the cathode 9 and the terminal section 16. When, further, the terminal section 16 is connected to an external input terminal such as FPCs (flexible print circuits), the adhesion preventive layer 6 eventually exists also between the terminal section 16 and the external input terminal. Because the adhesion preventive layer 6 has a small film thickness, the same characteristics as those obtained when the adhesion preventive layer 6 is not present are given and the cathode 9 is electrically connected to the terminal section 16, which makes it possible to send electric signals to the organic EL element 2.

In the above embodiment, the support substrate 3 and/or the seal plate 4 may be made from a flexible film.

1-2. Characteristics of this Embodiment

A process of producing the organic EL display panel 1 shown in FIG. 1 by using the production process according to this embodiment will be hereinafter explained with reference to FIGS. 3A-3F and 4A-4C.

FIG. 3A is a typical plan view of the support substrate 3 before the steps in the production process according to this embodiment is carried out. Here, explanations will be furnished as to the case of producing four organic EL display panels. However, the same procedures may be applied to the case of producing plural (excluding four) organic EL display panels. The dividing part 51, the element region 31 and the terminal section 16 in the state where the organic EL display panel is produced using the production process according to this embodiment are illustrated in FIG. 3A for the sake of simplicity.

First, the terminal section 16 and the anode 7 are formed on the support substrate 3.

Next, the above adhesion preventive layer 6 is formed on the surface including the dividing part 51 on the support substrate 3. In this embodiment, the case of allowing the entire surface of the support substrate 3 to be hydrophobic will be explained as the step of forming this adhesion preventive layer. FIG. 3B is a typical plan view of the surface of the support substrate when the entire surface of the support substrate is made hydrophobic. The hydrophobic region can be formed without patterning by allowing the entire surface of the support substrate 3 to be hydrophobic at a time and the process of producing the organic EL display panel 1 can be therefore simplified.

In this embodiment, the adhesion preventive layer 6 is formed on the entire surface of the support substrate 3. However, the present invention is not limited to this and the adhesion preventive layer 6 may be formed on the surface including the dividing part 51 on the support substrate 3. Also, in this embodiment, the surface of the support substrate 3 is made hydrophobic in the adhesion preventive layer forming step. The present invention is not limited to this and a layer that prevents the seal layer 5 from adhering to the surface of the support substrate may be formed.

The hydrophobic treatment may be carried out by forming a hydrophobic film of, for example, an organic fluoride compound. Also, the surface of the support substrate 3 may be subjected to silane coupling treatment using a silane coupling agent. These silane coupling agents may be represented by the formula $X—Si(OR)_3$. When the X-part is a substituent that does not react with the seal layer 5, for example, a substituent having fluorine such as a trifluoropropyl group, the surface of the support substrate 3 can be made hydrophobic by carrying out the silane coupling treatment of the surface of the support substrate 3 using such a silane coupling agent. For example, $CF_3CH_2CH_2Si(OCH_3)_3$ trifluoropropyltrimethoxysilane) or the like may be used. The above silane coupling treatment is carried out by applying the coupling agent to the surface on the side to which the display region 31 is applied between the support substrate 3 and the seal plate 4 through the seal layer 5 among the surface of the support substrate 3 and by carrying out drying treatment in the specified conditions after the coupling agent is applied.

Next, the organic EL element 2 (excluding the anode 7) is formed on the surface of the support substrate 3. FIG. 3C is a typical plan view in the case of forming the display region 31 constituted of the organic EL element 2 on the support substrate 3. The organic EL element 2 has the structure as mentioned above. In this case, the organic EL element 2 is formed such that the anode 7 and cathode 9 of the organic EL element 2 are electrically connected to the aforementioned terminal section 16.

Next, the above limiting layer 11 is formed on the support substrate 3. In this embodiment, the limiting layer 11 is formed so as to include the display region 31 and to exclude the dividing part 51. In this embodiment, the case of making such a region non-hydrophobic will be explained. FIG. 3D is a typical plan view of the support substrate 3 when its surface is made non-hydrophobic in this manner.

Such non-hydrophobic treatment, by which hydrophobic groups existing on the surface of a material are covered, very decreases hydrophobic groups exposed from the surface to thereby make easy to stick the seal layer 5 to the display region 31.

For such the non-hydrophobic treatment, a low moisture permeation film may be formed as the protective film so as to coat the display region 31. When the low moisture permeation film is formed as the protective film, it prevents the occurrence of the phenomenon that moisture is penetrated into the organic material constituting the organic EL element 2 and deteriorates the organic material and it is therefore possible to provide a more highly reliable organic EL display panel 1. Such a protective film is formed by patterning using, for example, a mask. Therefore, in the case of forming such a protective film for promoting non-hydrophobic properties, a reliability-improving step and a non-hydrophobic step can be carried out simultaneously. This makes it possible to carry out patterning of a hydrophobic region and a non-hydrophobic region without new patterning using, for example, photolithography for promoting non-hydrophobic properties and the process of producing the organic EL display panel 1 can be therefore simplified.

When a hydroxyl group exists on the surface of the protective film, the protective film has high adhesion to the seal layers. It is therefore preferable to form the protective film by using a CVD method for forming a hydroxyl group on the surface. Also, when the outermost surface of the protective layer is an organic material, a hydroxyl group may be formed on the surface of the protective film by plasma treatment in the presence of oxygen.

Moreover, an adhesive forming the seal layer 5 is applied to the surface of the seal plate 4 on the side to be applied to the support substrate 3. The present invention can be practiced whether the adhesive is applied to the surface of the support substrate 3 or the surface of the seal plate 4. It is, however, preferable to apply the adhesive to the surface of the seal plate 4.

When an adhesive is applied using a dispenser, there is a fear that the projecting part of the dispenser accidentally collides with a surface to which the adhesive is to be applied. In the case where the projecting part accidentally collides with the organic EL display part 31 formed on the support substrate 3, there is a fear that the organic EL element 2, TFT and signal wiring connected to electrodes and TFT are damaged, bringing about display defects. This embodiment, on the contrary, does not reach the stage where display defects as mentioned above are caused even if color filters are damaged.

Also, ultraviolet ray-curable resins and the like which are used as the adhesive exhibit an acidic state before cured. If there are defects such as cracks which probably arise in layers disposed on the support substrate when the adhesive is applied to the support substrate 3, there is a fear that the acidic adhesive penetrates from these defects and deteriorates the characteristics of the organic EL element 2 and TFT. In the case of applying the adhesive to the seal plate 4, on the contrary, the support substrate 3 and the seal plate 4 are exposed to the above acidic circumstance for only the time taken until the adhesive is cured since both plates are stuck to each other and therefore, it is less possible that the acidic adhesive penetrates and deteriorates the characteristics of the organic EL element 2 and TFT even if defects such as cracks arise in the layer on the support substrate.

FIG. 3E is a typical plan view when an adhesive forming the seal layer 5 is applied to the surface of the seal plate 4. In this embodiment, the region where the adhesive is to be applied includes a region corresponding to the above region which is made non-hydrophobic on the support substrate 3 and excludes a region corresponding to the terminal section 16. The region where the adhesive for forming the seal layer 5 is to be applied is preferably a region from which the region corresponding to the terminal section 16 is excluded though it may be the whole surface of the seal plate 4. This reason is as follows: after the neighboring organic EL display panels 1, 1 are divided at the dividing part 51, the seal plate 4 at the position corresponding to the place above the terminal section 16 is separated from the organic EL display panel 1 to expose the terminal section 16, and the above structure makes such separating works easy.

Next, the above support substrate 3 which has been made non-hydrophobic is applied to the seal plate 4 coated with the above seal layer. FIG. 3F is a typical plan view showing the support substrate 3 and the seal plate 4 which are applied to each other. Then, the seal layer 5 is cured in a specified condition to form a laminate 1a.

Next, the laminate 1a is divided at the dividing part 51 disposed between the display regions 31 adjacent to each other. FIGS. 4A-4C are typical sectional views for explaining the situation where the laminate 1a is divided at the dividing part 51. FIG. 4A is typical sectional view when the laminate 1a is cut along the line A-B in FIG. 3F.

On referring to FIGS. 4A-4C, the organic EL display panel 1 is structured by sealing the display region 31 on the support substrate 3 by the seal plate 4 through the seal layer 5. In FIGS. 4A-4C, two units of the display region 31 and the terminal section 16 are formed between the support substrate 3 and the seal plate 4 and each display region 31 is coated with the limiting layer 11.

As shown in FIG. 4A, a dividing groove 52 is formed on each surface of the support substrate 3 and the seal plate 4 corresponding to the dividing part 51. Next, an appropriate stress is applied to the laminate 1a, specifically, the laminate 1a is divided into the organic EL display panel 1 and an unnecessary portion 61 to take out the organic EL display panel 1 (two organic EL display panels in the case of FIG. 4B) as shown in FIG. 4B.

Here, the adhesion preventive layer 6 is prevented from adhering to the seal layer 5 in the region that is not coated with the limiting layer 11 and therefore, the laminate 1a is divided into the organic EL display panel 1 and an unnecessary portion 61 at the dividing part 51 by applying a proper stress to the laminate 1a. The seal layer 5 is prevented from adhering to the support substrate 3 also at the unnecessary portion 61 and therefore, the unnecessary portion 61 is easily separated at the interface between the seal layer 5 and the support substrate 3 when stress is applied.

Next, the seal plate 4 and seal layer 5 in the place positioned above the terminal section 16 are separated as shown in FIG. 4C by applying stress to the organic EL display panel 1. Since the adhesion preventive layer 6 exists on the surface of the terminal section 16, the surface of the terminal section 16 is prevented from adhering to the seal layer 5 at the interface between the both. Therefore, when stress is applied to the organic EL panel 1, the terminal section 16 is easily separated from the seal layer 5 at the interface of the surface of the terminal section 16 and the seal layer 5. Along with this, the unnecessary portion 62 including the place positioned above the terminal section 16 among the seal plate 4 and seal layer 5 in the organic EL display panel 1 can be removed from the support substrate 3.

The above explanations are offered as to the case where first the terminal section 16 and the anode 7 are formed on the support substrate 3 and then, the whole surface of the support substrate 3 is made to be hydrophobic. However, a process may be adopted in which after the terminal section 16 is formed on the support substrate 3, an operation for patterning is carried out such that the anode 7 is connected to the TFT terminal and the TFT terminal is exposed, to form the hydrophobic region and then the anode 7 is formed.

EMBODIMENT 2

In this embodiment, the above limiting layer 11 is formed, then, the surface of the limiting layer 11 is surface treated by a coupling agent and the support substrate 3 on which the limiting layer 11 is formed is applied to the seal plate 4 coated with the adhesive forming the seal layer 5. The embodiment 2 is the same as the embodiment 1 except for the above process.

The adhesive strength between the limiting layer 11 and the seal layer 5 can be improved by the surface treatment using such a coupling agent.

When the coupling agent has a reacting group that chemically combines with various seal layers 5, it can improve the interfacial strength with the seal layer 5.

The above surface treatment is carried out as follows: the coupling agent is applied to the side of the support substrate 3 to which side the display region 31 is applied through the seal layer 5 between the support substrate 3 and the seal plate 4 among the surface of the support substrate 3, and after the coupling material is applied, drying treatment is carried out in a specified condition.

The adhesion between the support substrate 3 and the seal plate 4 is improved by carrying out the above surface treatment, which prevents the occurrence of the phenomenon that moisture is penetrated into the organic EL element 2 and deteriorates the luminous characteristics of the organic EL element 2.

As the coupling agent, there are a silane coupling agent, titanium type coupling agent and aluminum type silane coupling agent. Among these agents, a silane coupling agent is particularly preferable. A silane coupling agent (X—Si(OR)$_3$) is hydrolyzed into a silanol (X—Si(OH)$_3$), which adsorbs to the surface of the limiting layer 11 like a hydrogen bond, and then enters into a dehydration condensation reaction with hydroxyl groups on the surface of the limiting layer 11 by heat treatment to form a firm chemical bond —O— with the limiting layer 11. Also, in the case where the X— part in the structure of the above formula is a substituent that reacts with the seal layer 5 to form a firm chemical bond, the adhesion of the silane coupling agent to the seal layer 5 is made firm. Therefore, the adhesive strength between the limiting layer 11 and the seal layer 5 is improved. When no hydroxyl group exists on the surface of the limiting layer 11, the silane coupling agent forms a less firm chemical bond —O— with a non-hydrophobic film and therefore the adhesive strength between the limiting layer 11 and the silane coupling agent drops more greatly as compared with the case where hydroxyl groups are present. Therefore, in the case no hydroxyl group is present on the surface of the limiting layer 11, the adhesive strength between the limiting layer 11 and the seal layer 5 is not higher than in the case where hydroxyl groups exist.

Therefore, when surface treatment using a coupling agent is carried out, the limiting layer 11 at the place with which the adhesive is to be in contact preferably has hydroxyl groups present on the surface thereof to maintain more firm adhesive strength.

In the reaction of the silane coupling agent with the limiting layer 11, alcohol is generated during hydrolyzing and water is generated during heating as gas (out gas). This out gas gives rise to oxidation of the metal electrodes and denaturation of the organic material of the organic EL element 2 and is a cause of a deterioration in the organic EL element 2.

No particular limitation is imposed on the silane coupling agent. Examples of materials which may be used as the silane coupling agent include vinyltrichlorosilane, vinyltris(β-methoxyethoxy)silane, vinyltriethoxysilane, vinyltrimethoxysilane, γ-methacryloxypropyltrimethoxysilane, γ-methacryloxypropylmethyldimethoxysilane, β-(3,4-epoxycyclohexyl)ethyltrimethoxysilane, γ-glycidoxypropyltrimethoxysilane, γ-glycidoxypropylmethyldimethoxysilane, γ-glycidoxypropylmethyldiethoxysilane, N-β(aminoethyl) γ-aminopropyltrimethoxysilane, N-β(aminoethyl)γ-aminopropylmethyldimethoxysilane, γ-aminopropyltriethoxysilane, N-phenyl-γ-aminopropyltrimethoxysilane, γ-mercaptopropyltrimethoxysilane, γ-mercaptopropyltriethoxysilane, 3-aminopropylmethyldiethoxysilane, 3-ureidopropyltriethoxysilane, 3-ureidopropyltrimethoxysilane, 3-aminopropyltrimethoxysilane, 3-aminopropyl-tris(2-methoxy-ethoxy-ethoxy)silane, N-methyl-3-aminopropyltrimethoxysilane, triaminopropyltrimethoxysilane, 3-4,5-dihydroimidazole-1-yl-propyltrimethoxysilane, 3-methacryloxypropyltrimethoxysilane, 3-mercaptopropylmethyldimethoxysilane, 3-chloropropylmethyldimethoxysilane, 3-chloropropyldimethoxysilane, 3-cyanopropyltriethoxysilane, hexamethyldisilazane, N,O-bis(trimethylsilyl)acetamide, methyltrimethoxysilane, methyltriethoxysilane, ethyltrichlorosilane, n-propyltrimethoxysilane, isobutyltrimethoxysilane, amyltrichlorosilane, octyltriethoxysilane, phenyltrimethoxysilane, phenyltriethoxysilane, methyltri(methacryloyloxyethoxy)silane, methyltri(glycidyloxy)silane, N-β(N-vinylbenzylaminoethyl)-γ-aminopropyltrimethoxysilane, octadecyldimethyl[3-(trimethoxysilyl)propyl]ammonium chloride, γ-chloropropylmethyldichlorosilane, γ-chloropropylmethyldimethoxysilane, γ-chloropropylmethyldiethoxysilane, trimethylsilylisocyanate, dimethylsilylisocyanate, methylsilyltriisocyanate, vinylsilyltriisocyanate, phenylsilyltriisocyanate, tetraisocyanatesilane and ethoxysilaneisocyanate. These compounds may be used either singly or in combinations of two or more. Also, examples of materials which may be used as the titanium coupling agent include isopropyltrioctanoyl titanate, isopropyldimethacrylisostearoyl titanate, isopropyltridecylbenzenesulfonyl titanate, isopropylisostearoyldiacryl titanate, isopropyltri(dioctylphosphate) titanate, isopropyltricumylphenyl titanate, isopropyltris(dioctylpyrophosphate) titanate, isopropyltris(n-aminoethyl) titanate, tetraisopropylbis(dioctylphosphite) titanate, tetraoctylbis(ditridecylphosphite) titanate, tetra(2,2-diallyloxymethyl-1-butyl)bis(ditridecyl)phosphite titanate, dicumylphenyloxyacetate titanate, bis(dioctylpyrophosphate)oxyacetate titanate, tetraisopropyl titanate, tetranormalbutyl titanate, butyl titanate dimer, tetra(2-ethylhexyl)titanate, titanium acetylacetonate, polytitanium acetylacetonate, titanium octyleneglycolate, titanium lactate ammonium salt, titanium lactate, titanium lactate ethyl ester, titanium triethanolaminate, polyhydroxytitanium stearate, tetramethyl orthotitanate, tetraethyl orthotitanate, tetrapropyl orthotitanate, tetraisobutyl orthotitanate, stearyl titanate, cresyl titanate monomers, cresyl titanate polymers, diisopropoxy-bis(2,4-pentadionate)titanium (IV), diisopropyl-bis-triethanol aminotitanate, octylene glycol titanate, tetra-n-butoxytitanium polymer, tri-n-butoxytitanium monostearate polymers and tri-n-butoxytitanium monostearate. These compounds may be used either singly or in combinations of two or more. Examples of materials which may be used as the aluminum type coupling agent include aluminum chelate compounds such as ethylacetoacetate aluminumdiisopropylate, aluminum tris(ethylacetoacetate), alkylacetoacetate aluminum diisopropylate, aluminum monoacetylacetate bis (ethylacetoacetate), aluminum tris(acetylacetonate), aluminum=monoisopropoxymonoooleoxyethylacetoacetate, aluminum-di-n-butoxidomonoethyl acetoacetonate and aluminum-di-iso-propoxido-monoethylacetoacetate and aluminum alcoholates such as aluminum isopropylate, mono-sec-butoxyaluminum diisopropylate, aluminum-sec-butyrate and aluminum ethylate. These compounds may be used either singly or in combinations of two or more.

As a method of applying these coupling agents, a spraying method, spin coating method or printing method may be used.

The following method may be adopted instead of the surface treatment using the above coupling agent. Specifically, the support substrate 3 and the seal plate 4 are applied to each other through a seal layer containing the above coupling agent, hydroxyl groups on the surface of the limiting layer 11 are reacted with the coupling agent contained in the seal layer 5 by heating and then the out gas is removed from the laminate 1a under reduced pressure, whereby the seal layer 5 can be cured. The adhesive strength of the support substrate 3 to the seal plate 4 is improved also by this production method and external moisture can be therefore prevented from penetrating into the organic EL element 2 and it is also possible to suppress the penetration of the out gas generated from the interface at which the limiting layer 11 and the seal layer 5 are bound with each other, into the laminate 1a. The deterioration of the organic EL element 2 caused by the out gas can be therefore limited and it is therefore possible to manufacture a highly reliable organic EL display panel 1.

Also, even in the case where the above surface treatment using the coupling agent is not carried out and the seal layer 5 containing the above coupling agent is used, the limiting layer 11 which is the place in contact with the seal layer 11 can retain more firm adhesive strength by making hydroxyl groups exist rather on the surface of the limiting layer.

EXAMPLES

Example 1

Examples in which an organic EL display panel 1 is manufactured using the production process of the above embodiment 1 will be shown.

As shown in FIG. 3A, a terminal section 16 was formed on a support substrate 3 made of a TFT substrate. As the terminal section 16, a Cr film was formed by a sputtering method.

Also, an anode 7 was formed on an electrode of the TFT substrate 6 and a cell separation film 10 was further formed.

Next, an adhesion preventive layer 6 was formed on the entire surface of the support substrate 3 (FIG. 3B). As the adhesion preventive layer 6, carbon fluoride ($CF_x$) was formed by a plasma CVD (chemical vapor phase deposition) method using methane trifluoride ($CHF_3$) as raw material gas. The film was formed in the following condition: pressure when the film was formed: 20 Pa, power used to apply bias voltage: 100 W, time for film formation: 10 seconds.

In succession, as shown in FIG. 3C, an organic film 8 was vapor-deposited on the support substrate 3 by using a mask and a cathode 9 was formed using a mask to thereby form a display region 31 comprising organic EL elements 2, 2 . . . .

Next, as shown in FIG. 3D, a laminate film constituted of silicon nitride/silicon oxide/silicone nitride was formed as a limiting layer 11 which doubled as a protective film. Such a limiting layer 11 was formed by patterning using a mask so as to cover the display region 31.

Also, an adhesive constituted of a photocurable resin forming a seal layer 5 was applied to the side applied to the support substrate 3 among the surface of the seal plate 4. In this embodiment, as shown in FIG. 3E, the above adhesive was applied such that the region corresponding to the aforementioned limiting layer 11 above at least the support substrate 3 is covered and the region corresponding to the terminal section 16 on the support substrate 3 was removed.

Then, the seal plate 4 coated with the adhesive forming the seal layer 5 was applied to the support substrate 3 on which the limiting layer 11 was formed, in a reduced pressure atmosphere of 10 Pa. After that, the seal layer 5 applied to the seal plate 4 was irradiated with ultraviolet rays to secure the seal plate 4 to the support substrate 3 temporarily and the pressure was then returned to atmospheric pressure. The seal plate 5 was further irradiated with ultraviolet rays to thereby cure the seal layer 5, thereby forming a laminate 1a (FIG. 3F).

In succession, a process of producing the organic EL display panel 1 from the laminate 1a with reference to FIGS. 4A-4C. FIG. 4A is a typical sectional view along the line A-B in FIG. 3F. As shown in FIG. 4A, a kerf 52 was formed along a dividing part 51 in the seal plate 4 and the support substrate 3 by a diamond cutter. Moreover, the laminate 1a was divided into the organic EL display panel 1 and an unnecessary part 61 by applying stress to the seal plate 4 and the support substrate 3 as shown in FIG. 4B. Also, as shown in FIG. 4C, an unnecessary portion 62 was dismounted from the support substrate 3 in the organic EL display panel 1 to expose the terminal section 16.

In the organic EL display panel 1 after divided, any position other than the dividing part 51 was not broken without any cutting residue and crack.

According to the production process of the present invention, a useless seal layer was not left and a reduction in yield could be limited by a simple production method, whereby an organic EL display panel reduced in production cost could be produced.

Example 2

Next, an example in which an organic EL display panel 1 is manufactured using the production process of the above embodiment 2 will be shown.

In the aforementioned Example 1, a laminate film constituted of silicon nitride/silicon oxide/silicone nitride/silicon oxide was formed as a limiting layer 11 which doubled as a protective film, on the support substrate 3. Hydroxyl groups exist on the surface of the silicon oxide formed on the outermost part of the laminate film.

Next, a silane coupling agent solution was dripped on and applied to the support substrate 3 by a spin coater in a uniform film thickness. As the silane coupling agent solution, an aqueous 1% γ-aminopropyltriethoxysilane solution was used. After such a silane coupling agent solution was applied, it was dried in a specified condition.

In succession, the seal plate 4 coated with the adhesive that formed the seal layer 5 and was constituted of a photocurable resin was applied to the support substrate 3 which had been treated using a silane coupling agent.

The subsequent steps are the same as those in Example 1 and are therefore omitted.

In the organic EL display panel 1 after divided, any position other than the dividing part 51 was not broken without any cutting residue and crack in spite of the presence of the cured seal layer 5 between the support substrate 3 and the seal plate 4 corresponding to the dividing part 51 of the laminate 1a.

According to the production process of the present invention, a useless seal layer was not left and a reduction in yield could be limited by a simple production method, whereby an organic EL display panel reduced in production cost could be produced.

As mentioned above, the use of the present invention made it possible to produce an organic EL display panel by a simplified production steps without leaving a useless seal layer.

Thus, the present invention are explained based on the embodiment. It is to be understood by a person skilled in the art that this embodiment is an example, various modifications are possible in the combination of each structural element and each treating process of this embodiment and these modifications are within the scope of the present invention.

Also, in the aforementioned embodiment, the explanations are furnished as to the top emission structure in which the light emitted from the organic EL elements 2, 2 . . . is taken out of the seal plate 4 side. However, the technologies of the present invention may be applied to the bottom emission structure in which the light emitted from the organic EL elements 2, 2 . . . is taken out of the support substrate 3 side. When the technologies of the present invention are applied to the bottom emission structure, the same effect that is obtained in the above embodiment can also be obtained.

What is claimed is:

1. A display panel comprising;
    a support substrate;
    an organic electroluminescence element including an anode and a cathode, and being formed on the support substrate;
    a seal layer that is disposed on the organic electroluminescence element and constituted of an adhesive;
    a seal plate that is stuck to said organic electroluminescence element by the seal layer; and
    a terminal section comprising an anode leader part and a cathode leader part, and being disposed on said support substrate to drive said organic electroluminescence element, said anode being connected to said anode leader part, and said cathode being connected to said cathode leader part,
    wherein an organic fluoride layer is disposed in said organic electroluminescence element and above said terminal section.

2. The display panel according to claim 1, wherein said organic fluoride layer is a charge injection layer or a charge transport layer in said organic electroluminescence element.

3. The display panel according to claim 1, wherein said organic fluoride layer is an adhesion preventive layer disposed on said terminal section.

* * * * *